United States Patent [19]

Takahashi

[11] Patent Number: 4,674,621

[45] Date of Patent: Jun. 23, 1987

[54] SUBSTRATE PROCESSING APPARATUS

[75] Inventor: Nobuyuki Takahashi, Tokyo, Japan

[73] Assignee: Anelva Corporation, Tokyo, Japan

[21] Appl. No.: 790,289

[22] Filed: Oct. 22, 1985

[30] Foreign Application Priority Data

Oct. 31, 1984 [JP] Japan .................. 59-227928

[51] Int. Cl.⁴ .............................. B65G 29/00
[52] U.S. Cl. ...................... 198/378; 198/344; 198/474.1; 198/478.1; 414/225; 118/503
[58] Field of Search ............ 198/378, 346.2, 474.1, 198/379, 470.1, 478.1, 339.1, 344, 377, 802; 118/500, 503, 728, 729, 730; 414/225

[56] References Cited

U.S. PATENT DOCUMENTS

| | | | |
|---|---|---|---|
| 3,842,973 | 10/1974 | Rothert | 198/474.1 X |
| 4,030,622 | 6/1977 | Brooks et al. | 198/339.1 X |
| 4,092,952 | 6/1978 | Wilkie et al. | 118/503 X |
| 4,405,435 | 9/1983 | Tateishi et al. | 204/298 |
| 4,408,560 | 10/1983 | Caratsch | 118/503 X |
| 4,465,416 | 8/1984 | Burkhalter et al. | 198/346.2 X |
| 4,502,411 | 3/1985 | Gilbride et al. | 118/503 |
| 4,582,191 | 4/1986 | Weigand | 414/225 X |

Primary Examiner—Robert J. Spar
Assistant Examiner—Jonathan D. Holmes
Attorney, Agent, or Firm—Townsend & Townsend

[57] ABSTRACT

An apparatus for automatically sequentially processing a large number of substrates. A plurality of substrate processing stages are arranged around a single imaginary circle, and a substrate attaching/detaching stage has its center as one position on the single imaginary circle. A conveyor transports substrates to or from the substrate attaching/detaching stage. A substrate holder receives each substrate from the conveyor and transfers each substrate to the conveyor after processing. The holder includes a mechanism for changing the attitude of a substrate from horizontal to vertical, for conveying the substrate in the vertical attitude to the processing stages, and for changing the attitude of a processed substrate from vertical to horizontal. A revolving mechanism sequentially conveys the holder in the vertical attitude from the attaching/detaching stage to each processing stage and returns the holder to the substrate attaching/detaching stage. The revolving mechanism has a ring arranged such that a periphery thereof is aligned with the single imaginary circle and is intermittently rotated in one horizontal direction.

2 Claims, 6 Drawing Figures

SUBSTRATE PROCESSING APPARATUS

BACKGROUND OF THE INVENTION

The present invention relates to a substrate processing apparatus for automatically processing a large number of flat substrates in a sequential order in a vacuum atmosphere.

In thin film formation in the silicon monolithic IC fabrication process, about 1-$\mu$m thick thin metal or insulating film is formed on each of a large number of silicon wafers having, e.g., a diameter of 125 mm and a thickness of about 0.5 mm. The electrical, mechanical and physical characteristics of thin films formed are generally good when an impurity gas partial pressure in a vacuum chamber is low. From this reason, the vacuum chamber for sputtering is preferably exposed in an outer atmosphere only for a minimum period of time. In order to process a large number of silicon wafers, it is preferable to shorten gas supply/exhaust time and evacuation time with respect to the total processing time. In order to effectively perform reproducible thin film formation for a large number of wafers, the wafers are preferably automatically fed without being manually handled by the operator. Furthermore, a thin film of only a desired material and uniform thickness must be formed on the wafer. Neither dust particles should be mixed in nor the film should be partially formed to cause a pinhole. The wafers are vertically held during deposition so as to prevent dust particles from being accumulated on the wafers even if dust particles are generated in the vacuum chamber.

Various types of sputtering apparatuses have been proposed. U.S. Pat. No. 4,405,435 describes sputtering apparatuses of the related art. In such a sputtering apparatus, the wafers are horizontally fed by a belt conveyor mechanism one by one and heated or preprocessed, e.g., sputter etched. The preprocessed wafer is fed into a sputtering chamber. Horizontal and vertical position control of the wafer is performed by an arm holder mechanism. According to this mechanism, reliability of transfer operation between the belt conveyor mechanism for the wafer and an arm serving as a wafer holder during film deposition is so poor that the wafer cannot be properly held. The next unprocessed wafer must wait until the current unprocessed wafer is held by the arm holder mechanism, thus resulting in one of the obstacles preventing high productivity.

In the film deposition chamber, the horizontally or vertically movable arm is combined with a single cathode. The resultant mechanism can perform only deposition of a single material in a single film deposition chamber. In order to deposit two different films on a single wafer according to the conventional system, another horizontally or vertically movable mechanism consisting of an arm and a cathode is required to feed the wafer again, thus requiring a large and complex system.

SUMMARY OF THE INVENTION

It is an object of the present invention to provide a simple, compact substrate processing apparatus for automatically processing a large number of substrates in a sequential order.

In order to achieve the above object of the present invention, there is provided a substrate processing apparatus comprising: a plurality of substrate processing stages arranged to surround a single imaginary circle; a substrate attaching/detaching stage having its center at a position on the single imaginary circle; a substrate convey mechanism for conveying an unprocessed substrate in a horizontal state to the substrate attaching/detaching stage and conveying a processed substrate in the horizontal state from the substrate attaching/detaching stage; a substrate holder for holding of the substrate from the substrate conveyor mechanism, changing a posture of the substrate from the horizontal state to a vertical state, conveying the substrate in the vertical state to the substrate processing stages, changing the posture of a processed substrate from the vertical state to the horizontal state, and transferring the processed substrate to the substrate conveyor mechanism; and a revolving mechanism comprising a disk or ring arranged such that a periphery thereof is substantially aligned with the single imaginary circle and being intermittently rotated in one horizontal direction, the disk or ring being provided with at least one substrate holder on a surface along the periphery, the revolving mechanism being adapted to sequentially conveying the substrate holder in the vertical state from the substrate attaching/detaching stage to each substrate processing stage and thereafter return the substrate holder to the substrate attaching/detaching stage.

DETAILED DESCRIPTION OF THE PREFERRED EMBODIMENTS

A substrate processing apparatus according to an embodiment of the present invention will be described with reference to the accompanying drawings.

Figure 1:
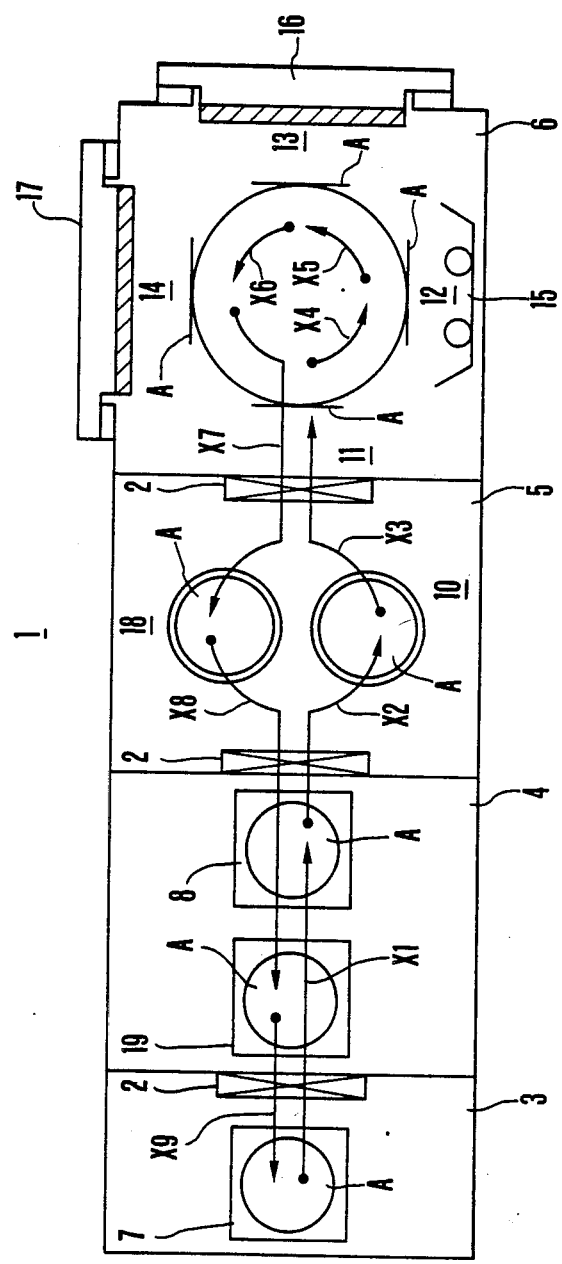
FIG. 1 is a schematic diagram of a substrate processing apparatus according to an embodiment of the present invention.

FIG. 1 is a schematic diagram of a sputtering apparatus as a substrate processing apparatus according to an embodiment of the present invention. Referring to FIG. 1, a sputtering apparatus 1 has four chambers which can be independently evacuated by corresponding valves 2. The four chambers consist of a load lock chamber 3, a buffer chamber 4, an etching chamber 5 and a sputtering chamber 6. These vacuum chambers are independently evacuated by vacuum pumps (not shown).

A plurality of unprocessed wafers A horizontally held in a cassette 7 in the chamber 3 are sequentially conveyed one by one by a substrate conveyor mechanism along a direction indicated by an arrow X1. Each wafer A is temporarily held in a first cassette 8 in the buffer chamber 4. The wafer A is conveyed to an etching stage 10 in the etching chamber 5 along a direction indicated by an arrow X2 and is preprocessed, i.e., etched. The wafer A is then conveyed to the chamber 6 in a direction indicated by an arrow X3 and is held by the wafer holder and erected by a mechanism on a substrate attaching/detaching stage (to be described later) 11. Then the wafer holder holding the wafer A in the vertical state is conveyed by a revolving mechanism (to be described later) to a heating stage 12 along a direction indicated by an arrow X4. The wafer A is heated by a heating lamp 15 and is fed to a first film deposition stage 13 in a direction indicated by an arrow X5. The wafer A opposes a first cathode 16 so as to perform a film deposition process. When a predetermined period of time has elapsed, the wafer A is further fed to a second film deposition stage 14 in a direction indicated by an arrow X6 and opposes a second cathode 17 so as to perform a film deposition process. The wafer A is conveyed along a direction indicated by an arrow X7, and the posture of the wafer A is changed from the vertical state to the horizontal state through the substrate attaching/detaching stage 11. The wafer A is conveyed to a post processing stage 18 in the etching chamber 5 in a direction indicated by an arrow X8 and is temporarily held in a second cassette 19 in the buffer chamber 4. The processed wafer A is conveyed in a direction indicated by an arrow X9 and is returned to the original cassette 7. Since horizontal conveying in the chambers 3, 4 and 5 is performed by belt conveyor mechanisms described in detail in U.S. Pat. No. 4,405,435, a detailed description thereof will be omitted.

A wafer conveyor mechanism including a wafer holder in the sputtering chamber 6 will now be described in detail.

Figure 2A:
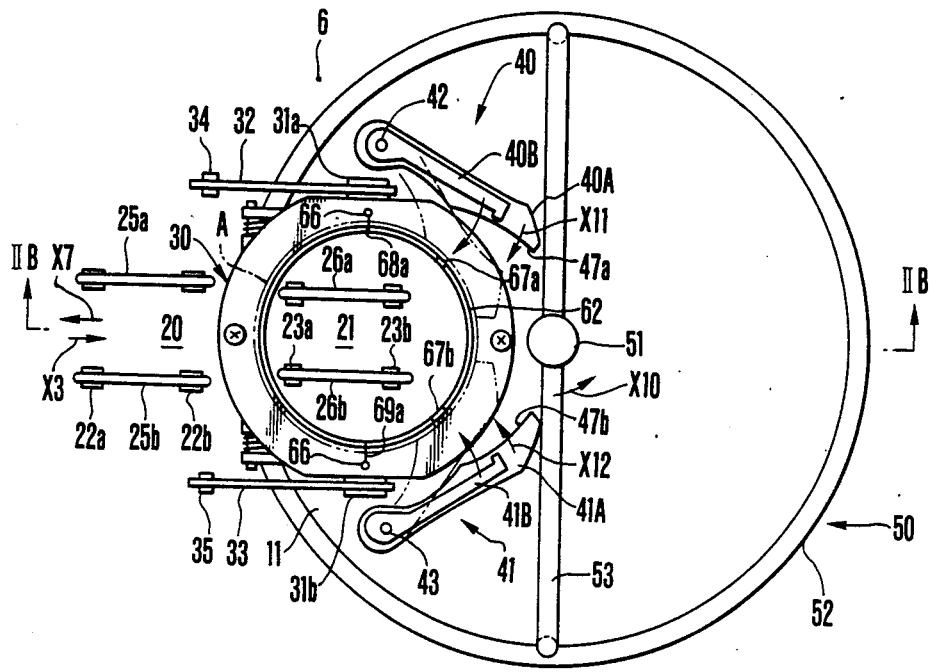
FIGS. 2A and 2B are respectively a plan view showing an interior of a sputtering chamber of FIG. 1 and a sectional view thereof taken along the line of IIB—IIB of FIG. 2A, respectively.
Figure 2B:
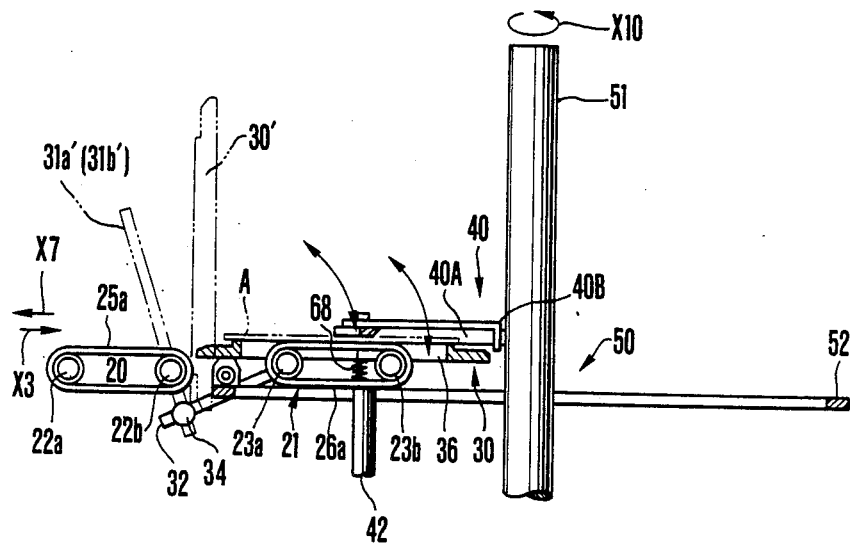

FIG. 2A is a plan view of a belt conveyor mechanism, a wafer holder and a revolving mechanism in the substrate processing apparatus of this embodiment, and FIG. 2B is a sectional view of the arrangement taken along the line IIB—IIB of FIG. 2A. Referring to FIGS. 2A and 2B, two pairs of belt conveyor mechanisms 20 and 21 are driven together with a belt conveyor mechanism (not shown) arranged in the etching chamber, so that the wafer A is conveyed in a horizontal state along a direction indicated by an arrow X3. The wafer A is guided from the etching chamber 5 to the sputtering chamber 6 and is held by a wafer holder 30.

The wafer holder 30 is held substantially in a horizontal state on the stage 11 in accordance with the mechanism and operation to be described in detail below. The wafer A is placed on the wafer holder 30, as indicated by the alternate long and two short dashed line. The horizontal state of the wafer holder 30 is maintained by urging a pair of earrings 31a and 31b disposed at two sides of the holder 30 by a pair of press arms 32 and 33. A pair of arm mechanisms 40 and 41 are disposed near the substrate attaching/detaching stage 11 to clamp the wafer holder 30 in the horizontal state from the two sides. The arm mechanisms 40 and 41 can be horizontally rotated about drive shafts 42 and 43, respectively. The wafer holder 30 is mounted on a revolving mechanism 50 (to be described later).

The wafer holder 30, the revolving mechanism 50, the arm mechanisms 40 and 41, the press arms 32 and 33 and the belt conveyor mechanisms 20 and 21 are actuated with predetermined motion, so that the wafer holder 30 receives the wafer A in the horizontal state in the substrate attaching/detaching stage 11. The posture of the wafer holder 30 is changed from the horizontal state to the vertical state. The wafer A in the vertical state is conveyed by the wafer holder 30 to the wafer processing state. After film deposition is completed, the processed wafer is conveyed to the substrate attaching-/detaching stage 11, and the posture of the wafer is changed from the vertical state to the horizontal state.

The wafer A in the horizontal state is transferred to the belt conveyor mechanisms 20 and 21. The detailed arrangement and its driving system are the main features of the present invention and will be described in detail below.

As shown in FIGS. 2A and 2B, the revolving mechanism 50 includes a rotating shaft 51, a ring-like revolving base plate 52, a connecting rod 53 for connecting the rotating shaft 51 and the revolving base plate 52. The revolving mechanism 50 is driven by a drive source (not shown) and intermittently revolves about the rotating shaft 51 counterclockwise (i.e., in a direction indicated by an arrow X10 of FIG. 2A). The revolving mechanism 50 stops at the predetermined position. The wafer holder 30 is sequentially conveyed from the substrate attaching/detaching stage 11 to the heating stage 12, the first film deposition stage 13 and the second film deposition stage 14, which are all described with reference with FIG. 1. The processed wafer A is then returned to the substrate attaching/detaching stage 11. For this reason, the wafer holder 30 is disposed above the revolving base plate 52.

One end of each of the press arms 32 and 33 is supported by a corresponding one of the shafts 34 and 35 and is rotatable for a predetermined angle in the vertical direction. When the arms 32 and 33 are laid down to the position indicated by the solid line of FIG. 2B, they urge the earrings 31a and 31b, respectively, so that the wafer holder 30 is pivoted and held completely horizontally. However, when the arms 32 and 33 are pivoted counterclockwise in FIG. 2B and raised to the position indicated by the alternate long and two short dashed line 31a' (or 31b'), the wafer holder 30 stands up substantially vertically by the force of a spring (to be described later), as indicated by an alternate long and two short dashed line 30'. When the wafer holder 30 is held in the horizontal state on the substrate attaching-/detaching stage 11, the belt conveyor mechanism 21 is located in a central space 36 in the wafer holder 30.

The two pairs of belt conveyor mechanisms 20 and 21 feed, in a direction indicated by the arrow X3 or X7, the wafer placed on belts 25a, 25b, 26a and 26b substantially in the horizontal state upon operation of a mechanism (not shown).

The arm mechanism 40 comprises a stopper arm 40A stopped at a predetermined position where the arm 40A is supported by the drive shaft 42 and pivotal along the horizontal direction, and a push arm 40B stopped at a predetermined position where the arm 40B is supported by the drive shaft 42 and pivotal along the horizontal direction. When the drive shaft 42 is rotated, a relative positional relationship between the push arm 40B and the shaft 42 is predetermined, so that a rotational angle between the two members is kept unchanged. However, the stopper arm 40A is not completely fixed to the drive shaft 42. Even if an external force for stopping the stopper arm 40A acts thereon, the drive shaft 42 can be continuously rotated. However, as this mechanism is not directly concerned with the scope of the present invention, a description thereof will be omitted. The arm mechanism 41 is located symmetrically with the arm mechanism 40, having the belt conveyor mechanism 21 interposed therebetween. The arm mechanism 41 comprises a stopper arm 41A and a push arm 41B. The pair of arm mechanisms 40 and 41 are normally kept open and are separated away from the wafer holder 30, as shown in the solid line in FIG. 2A. However, when the wafer holder 30 is held in the horizontal state and receives the wafer A, the arm mechanisms 40 and 41 are brought into contact with the wafer holder 30, as described with reference to feeding of the wafer A.

When the wafer holder 30 receives the wafer A, the stopper arms 40A and 41A are pivoted clockwise and counterclockwise, i.e., along directions indicated by arrows X11 and X12, respectively, abut against stopper plates (not shown) and are stopped. In this case, inner edges 47a and 47b of the stopper arms 40A and 41A near the belt conveyor mechanism 21 abut against the periphery (i.e., the edge) of the wafer A. The wafer A conveyed by the belt conveyor mechanism 21 along the direction indicated by the arrow X3 is no longer conveyed by the belts 26a and 26b and is stopped at a proper position on the wafer holder 30. When a predetermined period of time has elapsed, the belt conveyor mechanism 21 can be interrupted. If the stopper arms 40A and 41A are not present, it is difficult to precisely locate the wafer in the predetermined position of the wafer holder 30 for a short period of time. The push arms 40B and 41B are used to cause the belt conveyor mechanisms 21 and 20 to feed the processed wafer A held by the wafer holder 30 from the position of the wafer holder 30 along the direction indicated by the arrow X7. When the wafer A is horizontally pushed out by the push arms 40B and 41B, the stopper arms 40A and 41A abut against the stopper plates (not shown) at positions indicated by the alternate long and short dashed lines of FIG. 2A. However, since the shafts 42 and 43 are further rotated, contact points between the push arms 40B and 41B and the wafer A become closer to the belt conveyor mechanism 21 than the contact surfaces between the stopper arms 40A and 41A and the wafer. Therefore, the push arms 40B and 41B push the wafer A along the direction indicated by the arrow X7. Even if the push arms 40B and 41B are not provided, since the wafer A can be separated from the wafer holder 30 and is fed by the belt conveyor mechanism 21, the push arms 40B and 41B are not more important than the stopper arms 40A and 41A. However, when the wafer A with a sputtered film is brought into tight contact with the wafer holder 30, the driving force of the belts 26a and 26b of the belt conveyor mechanism 21 and the friction force of the lower surface of the wafer A are not often sufficient to send out the wafer A. In this sense, the push arms 40B and 41B play an important role for properly sending out the wafer. As can be apparent from the above description, the pair of arm mechanisms 40 and 41 are symmetrically operated when the wafer holder 30 holds or releases the wafer A.

Figure 3:
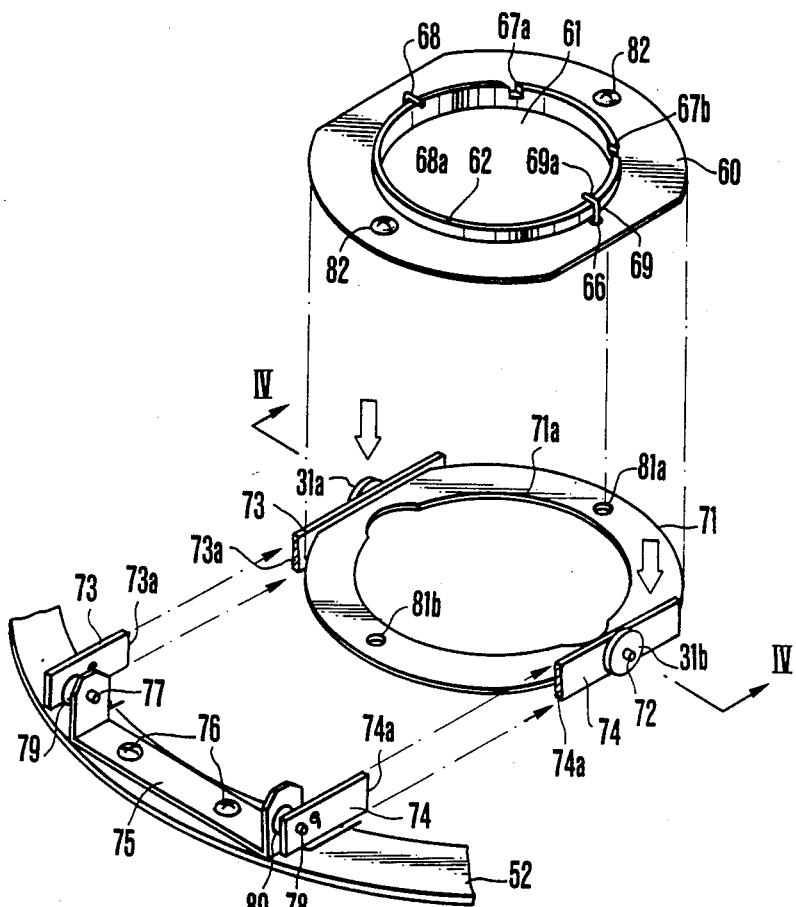
FIG. 3 is an exploded perspective view of a wafer holder.
Figure 4:
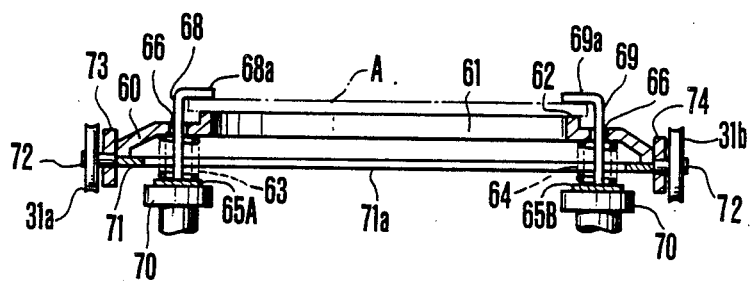
FIG. 4 is a sectional view of the wafer holder taken along the line IV—IV of FIG. 3.

FIGS. 3 and 4 show, respectively, the detailed arrangement of the wafer holder 30 shown in FIGS. 2A and 2B. FIG. 3 is an exploded perspective view of the wafer holder, and FIG. 4 is a sectional view thereof taken along the line IV—IV of FIG. 3. Referring to FIGS. 3 and 4, reference numeral 60 denotes an upper holder plate fixed on the upper surface of a lower holder plate 71 by set screws 82 threadably engaged with holes 81a and 81b. The upper holder plate 60 comprises substantially a ring plate which has a circular hole 61 at its center. The circular hole 61 is slightly smaller than the wafer A. An annular projection 62 extends upward along the periphery of the hole 61. The peripheral portion of the lower surface of the wafer is brought into contact with the annular projection 62. A pair of wafer chucking springs 63 and 64 are disposed at symmetrical positions on the lower surface of the upper holder plate 60 to urge wafer clamping pins 68 and 69 downward. The wafer clamping pins 68 and 69 extend upward from plates 65A and 65B located below the springs 63 and 64. The clamping pins 68 and 69 further extend through small holes 66 formed in the upper holder plate 60 and appear from the upper surface of the upper holder plate 60. The distal end portions of the clamping pins 68 and 69 are bent toward the center of the upper holder plate 60, thereby constituting bent portions 68a and 69a which are higher than the upper end of the projection 62. This structure prevents the pins 68 and 69 and the wafer chucking springs 63 and 64 from being removed from the upper holder plate 60. The bent portions 68a and 69a cooperate with the wafer chucking springs 63 and 64 to urge the wafer against the upper end of the annular projection 62. Two notches 67a and 67b are formed in the annular projection 62 so as to correspond to the push arms 40B and 41B. When the push pins (not shown) disposed at the distal ends of the arms 40B and 41B push the wafer A, the wafer A is not brought into contact with the surface of the annular projection 62 and can be fed over a long distance to a position near the belt conveyor mechanism 21.

A pair of plates 65A and 65B are located below the lower holder plate 71 and are respectively mounted on horizontal bases 70 fixed on the apparatus housing. Therefore, the wafer chucking springs 63 and 64 are compressed between the lower surface of the upper holder plate 60 and the upper surface of the plate 65A and between the lower surface of the plate 60 and the upper surface of the plate 65B. After the press arms 32 and 33 urge the earrings 31a and 31b to the position illustrated in full in FIGS. 2 and 3 and the upper holder plate 60 is held in the horizontal state, the wafer chucking springs 63 and 64 are compressed when the plates 65A and 65B abut against the bases 70, respectively. In other words, the upper holder plate 60 is moved downward in a horizontal state against the biasing force of the wafer chucking springs 63 and 64 even after the plates 65A and 65B abut against the bases 70. A distance between the annular projection 62 and the bent portions 68a and 69a of the wafer clamping pins 68 and 69 is increased. The wafer A is released from the bent portions 68a and 69a and can be easily slidably moved along the annular projection 62, and the next wafer fed by the belt conveyor mechanism 21 is inserted between the projection 62 and the bent portions 68a and 69a along the projection 62. When the wafer holder 30 is pivoted and vertically aligned, the wafer chucking springs 63 and 64 are elongated, so that the wafer clamping pins 68 and 69 urge the wafer A against the annular projection 62 by the biasing force of the springs 63 and 64. When the biasing force of the springs 63 and 64 is properly selected, the wafer A can be firmly held to the upper holder plate 60 even if the wafer holder 30 is vertically held.

The lower holder plate 71 is disposed between the distal end portions of a pair of arms 73 and 74. In FIG. 3, the arms 73 and 74 are conveniently cut and separated at the central portions thereof in order to make plain the drawing. The arms 73 and 74 are welded with the lower holder plate 71, so that the positional relationship therebetween is kept unchanged. The earrings 31a and 31b are rotatably mounted on the outer surfaces of the distal end portions of the arms 73 and 74 through shafts 72, respectively. The proximal portions of the arms 73 and 74 are coupled to a bracket 75 fixed by set screws 76 on the revolving base plate 52 and can be vertically pivotal through shafts 77 and 78, respectively. Torsion coil springs 79 and 80 are mounted on the shafts 77 and 78 between the bracket 75 and the arms 73 and 74. The springs 79 and 80 provide a biasing force to raise the arms 73 and 74, respectively. When spring constants of the torsion coil springs 79 and 80 are properly selected, the arms 73 and 74 can be laid down substantially in the horizontal state against the springs 79 and 80 when the earrings 31a and 31b are moved downward, respectively. When an external force is removed from the earrings 31a and 31b the arms 73 and 74 can be pivoted to stand on the revolving base plate 52.

As described above with reference to FIGS. 2A, 2B, 3 and 4, the wafer A is fed from the belt conveyor mechanisms 20 and 21 in the substrate attaching-/detaching stage 11 to the wafer holder 30, the wafer is held in the wafer holder 30, the wafer is fed from the wafer holder 30 to the belt conveyor mechanisms 20 and 21, and the wafer holder is alternately oriented in the horizonal and vertical states.

The operation for conveying the wafer holder 30 in the vertical state upon rotation of the revolving mechanism 50 will be described with reference to FIGS. 1, 2A and 2B. As indicated by the alternate long and two short dashed line 30' of FIG. 2B, the wafer holder 30 is held in the vertical state and the rotating shaft 51 is rotated through about 90° in the direction indicated by the arrow X10. The revolving base plate 52 coupled to the shaft 51 through the connecting rod 53 is also rotated, and the wafer holder 30 is fed to the heating stage 12 and stops there. As shown in FIG. 1, the wafer A receives heat from the heating lamp 15 and is heated to a predetermined temperature prior to film deposition. Subsequently, the rotating shaft 51 is rotated through about 90° again to feed the wafer holder 30 to the first film deposition stage 13. As shown in FIG. 1, the wafer A opposes the first cathode 16 and is subjected to film deposition. The rotating shaft 51 is further rotated through about 90°, and the wafer A is fed to the second film deposition stage 14. The wafer A opposes the second cathode 17 and is subjected to film deposition. Finally, the rotating shaft 51 is rotated through about 90° again, and the wafer holder 30 is fed back to the substrate attaching/detaching stage 11. The wafer holder 30 is rotated by the press arms 32 and 33 from the vertical state to the horizontal state. The processed wafer A is fed by the belt conveyor mechanism 21 to the etching chamber 5. The next unprocessed wafer A is fed from the etching chamber 5 to the sputtering chamber 6 and is loaded in the wafer holder 30. In this manner, when the revolving mechanism 50 is intermittently rotated in four 90° steps and revolves once, film deposition on each wafer A in the sputtering chamber 6 is completed. This operation is repeated to perform film deposition of the wafers A one by one.

Figure 5:
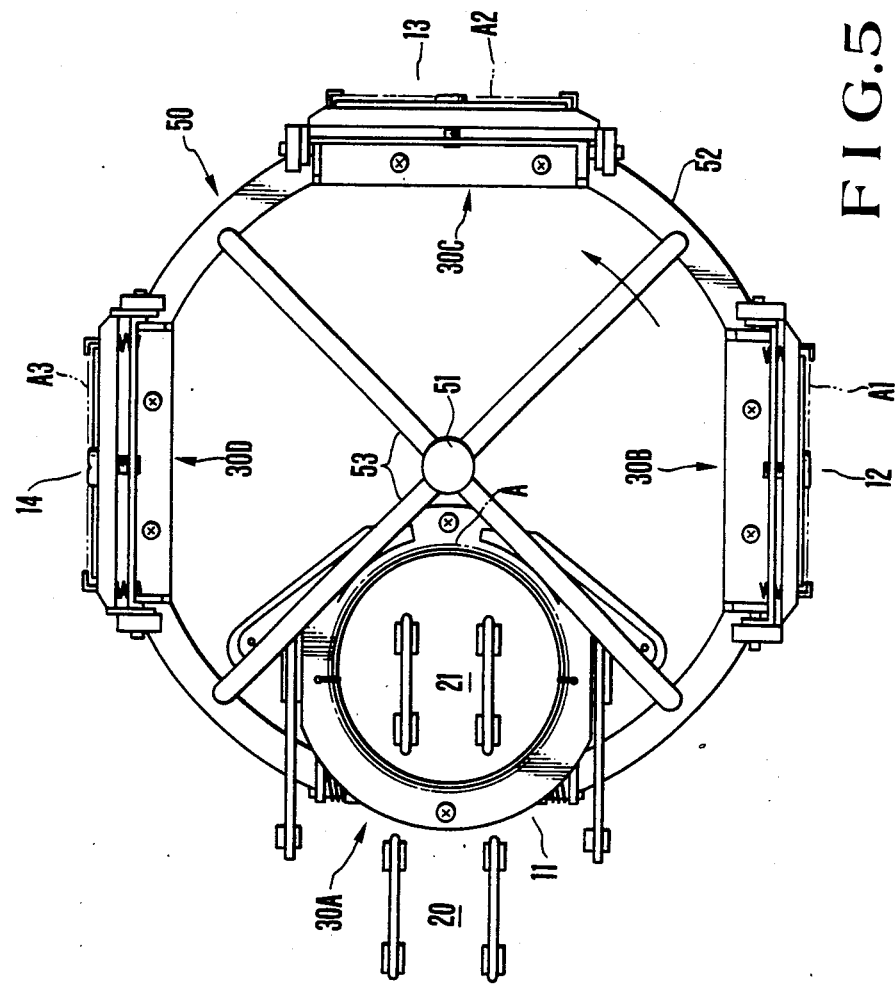
FIG. 5 is a plan view of a substrate processing apparatus according to another embodiment of the present invention.

FIG. 5 is a plan view of a wafer conveyor mechanism in a sputtering chamber according to another embodiment of the present invention. Although the substrate processing apparatus of the embodiment described in FIGS. 2A and 2B has the revolving mechanism 50 with one wafer holder 30, a revolving mechanism 50 of the second embodiment has four wafer holders 30A to 30D. The wafer holder 30A with the wafer A on a substrate attaching/detaching stage 11 has the same structure and function as those of FIGS. 2A and 2B. The wafer holder 30B is disposed in a heating stage 12 and is urged to stand on a revolving base plate 52 by the torsion coil spring substantially in the vertical direction. A wafer A1 on the wafer holder 30B can be heated on the spot. The wafer holder 30C is disposed on a first film deposition stage 13 and is in the vertical state on the plate 52. A wafer A2 on the wafer holder 30C opposes a first cathode on the spot and is subjected to film deposition. The wafer holder 30D is disposed in a second film formation stage 14 and substantially vertically stands on the revolving base plate 52 so as to hold a wafer A3 vertically. The wafer A3 opposes the second cathode and can be subjected to film deposition on the spot. Mutual transfer of the wafer A between the wafer holder 30A and the belt conveyor mechanisms 20 and 21 in the substrate attaching/detaching stage 11, and processing of wafers A1, A2 and A3 in the remaining stages 12, 13 and 14 can be simultaneously performed. Furthermore, all the wafer holders 30A to 30D are held substantially in the vertical state, and the rotating shaft 51 is rotated counterclockwise through about 90°, so that the revolving base plate 52 is rotated. The wafer holder 30A is stopped through the heating stage 12. At the same time, the wafer holders 30B, 30C and 30D are rotated through 90° and are stopped on the first and second film deposition stages 13 and 14, and the substrate attaching/detaching stage 11. As described above, the sputtering chamber has a maximum of four wafer holders which are independently fed and processed. As compared with the processing time of the embodiment of FIGS. 2A and 2B, the processing time of the second embodiment can be decreased to $\frac{1}{4}$.

According to the substrate processing apparatus of the present invention, the substrate holder is arranged in the revolving mechanism, and the holder is conveyed from the substrate attaching/detaching stage to the substrate processing stage upon rotation of the revolving mechanism. After the substrate or wafer is processed, the wafer is returned to the substrate attaching-/detaching stage. Therefore, a large number of substrates are automatically and sequentially processed, and productivity can be greatly improved. Furthermore, since the film can be deposited on the wafer while the wafer is held vertically by the substrate holder, dust will not attach to the wafer, and process reliability can be improved. The above embodiments exemplify sputtering. However, the present invention can also be applied to other thin film formation apparatuses such as a dry etching apparatus, a plasma-assisted CVD (Chemical Vapor Deposition) apparatus, a vacuum deposition apparatus, and a combination thereof. In the above embodiments, the silicon wafer is used as the substrate. However, the shape, material and dimensions of the substrate are not limited.

What is claimed is:
1. A substrate processing apparatus comprising:
    a plurality of substrate processing stages arranged to surround a single imaginary circle;
    a substrate attaching/detaching stage having its center at a position on the single imaginary circle;
    a substrate conveyor mechanism for conveying an unprocessed substrate in a horizontal attitude from said substrate attaching/detaching stage;
    a substrate holder means for receiving the substrate from said substrate conveyor mechanism and for transferring a substrate to said substrate conveyor mechanism after processing by said substrate processing stages, said holder means including means for changing the attitude of the substrate from the horizontal attitude to a vertical attitude, means for enabling the substrate to be transferred in the verti- cal attitude to said substrate processing stages, and means for changing the attitude of a processed substrate from the vertical attitude to the horizontal attitude; and a revolving mechanism comprising a disk or ring arranged such that periphery thereof is substantially aligned with the single imaginary circle and being intermittently rotated in one horizontal direction, said disk or ring being provided with at least one substrate holder means on a surface along the periphery, said revolving mechanism being adapted to sequentially convey said substrate holder meas in the vertical state from said substrate attaching/detaching stage to each substrate processing stage and thereafter return said substrate holder to said substrate attaching/detaching stage.

2. An apparatus according to claim 1, wherein said revolving mechanism has a plurality of substrate holder means, each of said plurality of substrate holder means being located on said substrate attaching/detaching stage at one of said plurality of substrate processing stages every time said revolving mechanism is intermittently stopped.

* * * * *